United States Patent

[11] 3,549,961

[72] Inventor John M. Gault
Manhattan Beach, Calif.
[21] Appl. No. 738,223
[22] Filed June 19, 1968
[45] Patented Dec. 22, 1970
[73] Assignee International Rectifier Corporation
Los Angeles, Calif.
a corporation of California

[54] TRIAC STRUCTURE AND METHOD OF MANUFACTURE
9 Claims, 14 Drawing Figs.

[52] U.S. Cl. .......... 317/235, 307/305; 317/234
[51] Int. Cl. .......... H01l 9/12
[50] Field of Search .......... 317/234, 235, 24, 28, 41, 41.1, 48; 307/305, 305(Triac Digest); 148/175

[56] References Cited

UNITED STATES PATENTS 3,123,750 3/1964 Hutson et al. .......... 317/235
3,275,909 9/1966 Gutzwiller .......... 317/235
3,278,237 10/1966 Topas .......... 148/33.2
3,443,171 5/1969 Knott et al. .......... 317/234

*Primary Examiner*—John W. Huckert
*Assistant Examiner*—R. F. Polissack
*Attorney*—Ostrolenk, Faber, Gerb & Soffen

ABSTRACT: A triac device in which semicircular cathode layers are epitaxially deposited on the opposite surfaces of a silicon wafer and are laterally spaced from one another by a distance of about a few minority carrier diffusion lengths. The central conductivity layer has an increased resistivity and minimizes transverse current which may cause injection of carriers into the central layer in the half of the wafer portion which has not been conducting. A gate layer is epitaxially deposited into the upper surface of the wafer and is aligned with a cathode layer on the bottom of the wafer. A second gate connection is made on the upper surface of the wafer and is laterally displaced from the bottom cathode layer.

INVENTOR.
JOHN M. GAULT
BY
OSTROLENK, FABER, GERB & SOFFEN
ATTORNEYS

INVENTOR.
JOHN M. GAULT
BY
OSTROLENK, FABER, GERB & SOFFEN
ATTORNEYS

TRIAC STRUCTURE AND METHOD OF MANUFACTURE

BACKGROUND OF THE INVENTION

This invention relates to a bidirectional semiconductor device and process for manufacture thereof, and more particularly relates to a high-power bidirectional semiconductor device which can be controllably gated to conduct in one or both directions.

Bidirectional semiconductor devices (hereinafter called "-triacs") are well known and are used for the control of AC current. Such devices are often thought of as antiparallel connected thyristors in a common wafer, with a slight gate modification. A device of this type is described in U.S. Pat. No. 3,275,909. Devices of this type have limited power capacity, and are fired by a negative gate signal applied to a common lead connected to each of the gate areas. Triac devices presently available also have limited voltage ratings and limited current-carrying capacity.

It has been found that the techniques described in U.S. Pat. No. 3,278,347 to Topas, assigned to the assignee of the present invention, for an epitaxially deposited cathode layer on a diffused wafer, can be adapted for use with a triac wafer configuration. Thus, in the present invention, central junctions are formed by a diffusion process, and the cathode layer regions and N-type gate region are formed by epitaxial deposition. Such devices have a forward withstand voltage (in each direction) of over 1,000 volts at current ratings of 200 amperes RMS.

As a further feature of the invention, a novel junction configuration is provided to permit control of either or both forward and reverse blocking characteristics of the device. In prior art triacs, the application of a gate signal to either of the gates will cause symmetric firing of the device in both forward and reverse directions. That is, it is not practical to control firing in one direction independently of firing in the opposite direction. The reasons for this can be understood by first considering the typical thyristor (or SCR). In normal operation, the SCR has a full half cycle to turn off before forward voltage is reapplied. If, during that time, a sufficiently large number of minority carriers remain in the central N-type region, the reapplication of forward voltage will cause collection of these carriers by the collector junction which, in turn, will case injection currents at the cathode and anode junctions. If these currents are large enough, the device will turn on again without a gate signal. In the prior art triac device, the half cycle for turnoff does not exist, since the device conducts in both directions. Therefore, the minority carriers created during conduction of one-half of the device will cause conduction of the other half when the main electrode voltage reverses because of the lateral proximity of the two cathode junctions.

In accordance with the invention, a horizontal separation is provided of the adjacent peripheries of the cathode layers on the opposite surface of the wafer by a distance of about several minority carrier diffusion lengths. In addition, the sheet resistance of the central layer is made high enough to minimize lateral currents which may cause injection of carriers into the central layer of the half of the device which has been nonconductive. Thus, sufficient time is provided for collection of minority carriers in the central layer of each half of the device without causing injection of carriers into the other half which would cause firing without a gate signal. By isolating the two halves of the device in this manner, it has been found that, for given sequence of conductivity types in a device, a negative gate signal with respect to one of the main terminals will cause symmetric firing in both directions of the device. However, a positive gate signal with respect to the same main terminal will cause firing only when the said one main terminal is negative with respect to the other main terminal, with no firing occurring when the said one main terminal is positive with respect to the other main terminal. Thus, appropriate gate signals can cause the device to operate either as an SCR, or triac. Obviously, suitable AC gate signals can be used in the usual manner.

As a further advantage of this arrangement, each half of the device is fired under the control of its own gate signal. Thus, higher frequency operation is attainable when the device is used as a pure AC switch, since one-half of the device will not be fired by the minority carriers of the other half before the other half turns off completely.

The combination of epitaxially formed cathode layers and gate layer and lateral separation between cathode layers has been found to produce other desirable characteristics in the device as compared to presently available devices. Thus, at relatively high temperatures, the device is found to withstand high dv/dt firing in absence of a gate signal.

A further important feature of the invention lies in the use of a common gate electrode which extends extends across the epitaxially deposited gate layer to the immediately adjacent wafer portion of an opposite conductivity type. This arrangement simplifies the manufacture of the device, since only one gate lead connection has to be made to the device. Where desired, however, the two gates may be separated in a novel manner wherein the gate for one-half of the device (the forward half) is laterally displaced from the cathode layer of the other half of the device. Thus, the forward gate will define, with the remainder of the junctions beneath it, a P-N-P device, while the reverse gate, which is above its respective cathode layer, will define an N-P-N-P-N structure. Neither of these equivalent devices can switch in the manner of a four-layer device, which would place a high current demand on the gate circuit.

Accordingly, a primary object of this invention is to provide a triac device which can be gated to fire in the manner of a thyristor or triac.

Another object of this invention is to provide a novel triac having increased power capability.

A further object of this invention is to provide a novel triac which has an RMS current capacity in excess of 40 amperes.

Yet another object of this invention is to provide a novel gate configuration for a triac which reduces gate current demand.

A further object of this invention is to provide a novel method of manufacture for a triac.

Another object of this invention is to provide a novel triac device having an extended frequency range of operation.

These and other objects of this invention will become apparent from the following description when taken in connection with the drawings, in which.

Figure 11:
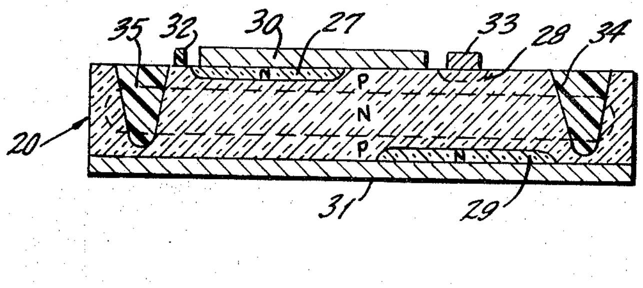
FIG. 11 is a cross-sectional view of FIG. 10 taken across the section line 11–11 in FIG. 10.
Figure 10:
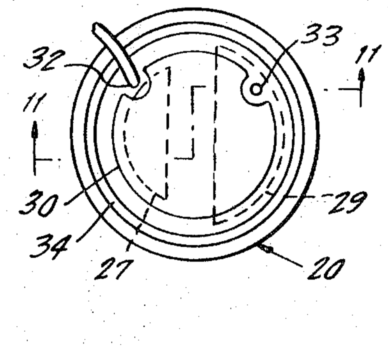
FIG. 10 is a top view of FIG. 9 after the formation of a groove therein to control metal ion migration, and to contour the rims of the junctions within the wafer.
Figure 12:
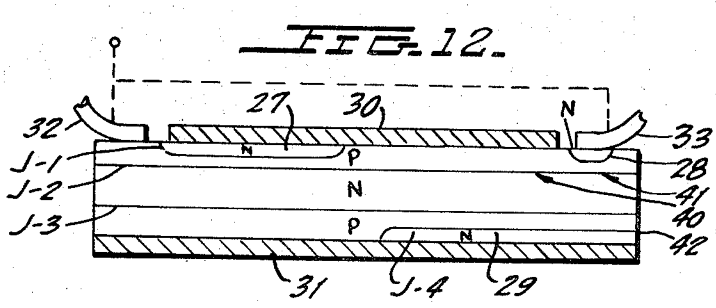

FIG. 12 schematically shows the device of FIGS. 10 and 11 to describe the operation thereof.

Figure 13:
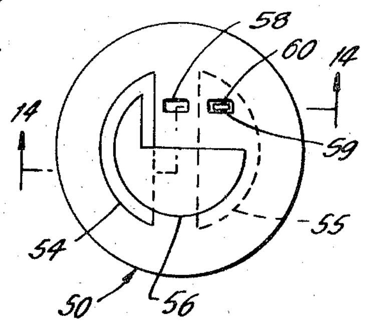

FIG. 13 is a top view of a second embodiment of the invention which uses an all-diffused wafer and separated gate regions.

Figure 14:
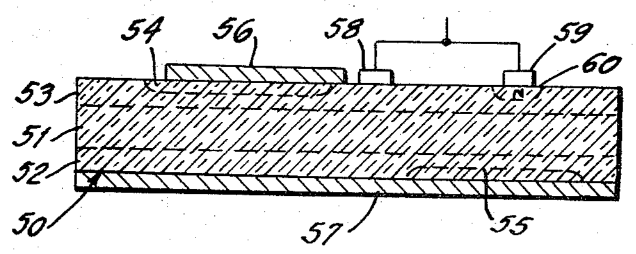

FIG. 14 is a cross-sectional view of FIG. 13 taken across section line 14—14 in FIG. 13.

Figure 2:
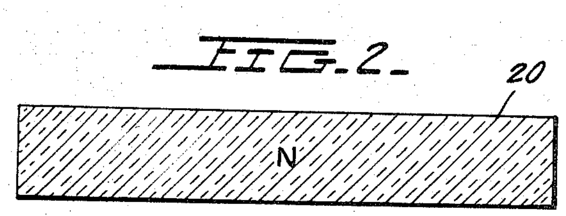
FIG. 2 is a cross-sectional view of FIG. 1 taken across section line 2–2 in FIG. 1.
Figure 1:
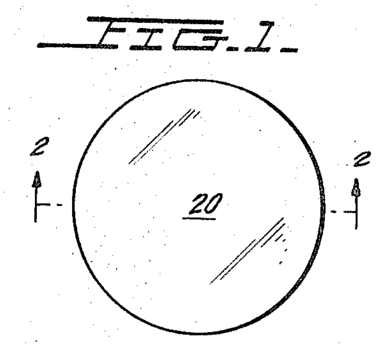
FIG. 1 is a top view of a silicon wafer from which the device of the invention is formed.

Referring first to FIGS. 1 and 2, there is shown a wafer 20 of monocrystalline silicon having a diameter of about 1 inch and a thickness of from 12 to 13 mils. The diameter of wafer 20 is dependent upon the current rating of the device, with a 1-inch wafer being used for devices having an RMS current rating of up to 200 amperes. Wafer 20 is of the N conductivity type and has a resistivity of about 30 ohm centimeters, and is suitably cleaned, as by etching in the usual manner, before further processing.

Figure 3:
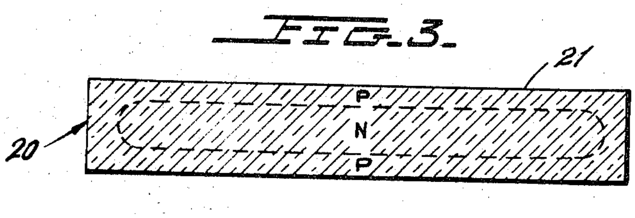
FIG. 3 shows the wafer of FIG. 2 after an initial diffusion operation.
Figure 5:
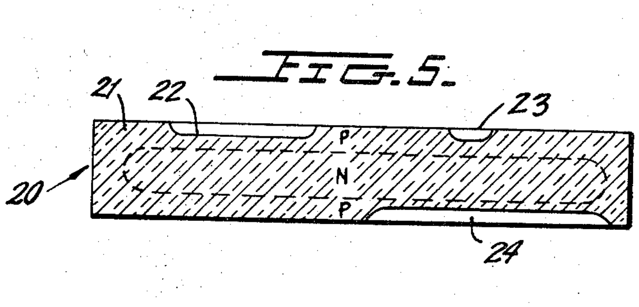
FIG. 5 is a cross section of FIG. 4 taken across section line 5–5 in FIG. 4.
Figure 4:
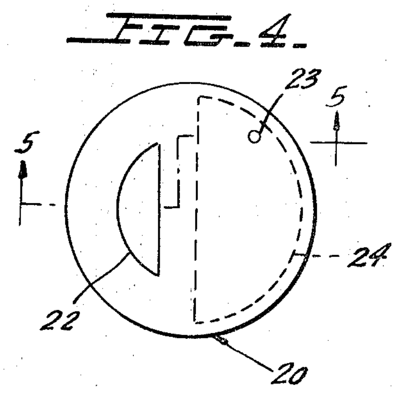
FIG. 4 is a top view of the wafer of FIG. 3 after the formation therein of wells which will receive epitaxially deposited silicon.

Wafer 20 is then placed in a suitable diffusion furnace and is given a diffusion treatment in accordance with well-known techniques to form a P-type shell 21 about the N-type wafer 20, as shown in FIG. 3. For example, a gallium diffusion treatment in an argon atmosphere may be used with the argon at a pressure of 450 millimeters of mercury. The diffusion temperature and time are coordinated to cause the diffusion of P-type impurities to a depth of about 4 mils. The opposite sides of wafer 20 are then lapped down so that the upper and lower P-type regions have a thickness of about 3—3.5 mils, while the central N region has a thickness of about 5 mils.

The wafer 20 is then prepared to receive epitaxial layers in its opposite surfaces by a process similar to that shown in U.S. Pat. No. 3,278,347. Thus, the wafer is suitably masked and immersed in an acid bath to etch wells 22 and 23 in its upper surface and well 24 in its bottom surface. A suitable etching medium is a mixture of HF and $HNO_3$ and acetic acid. The depth of wells 22, 23 and 24 is from 1 to 2 mils, and preferably is etched to a depth at which the surface resistance of the wells is about 20 ohms.

Each of wells 22 and 24 are semicircles having radii of about 350 mils and 450 mils, respectively. Well 23 may be generally circular in shape with a diameter of about 100 mils.

In accordance with a critical feature of the invention, wells 22 and 24 are laterally spaced from one another by at least three minority carrier diffusion lengths. For the material used in the embodiment described, this corresponds to about 15 mils. Obviously, this minimum spacing will differ, depending on the characteristics of the silicon used, since minority carrier diffusion length depends on the physical properties of the silicon and the impurities therein. By "lateral spacing" is meant the spacing, in a direction parallel to the plane of the wafer, between the adjacent boundaries of wells 22 and 24.

Figure 6:
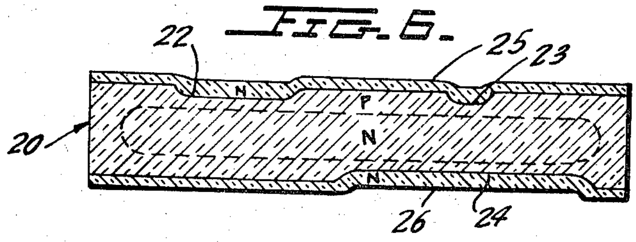
FIG. 6 shows the wafer of FIG. 5 after epitaxial deposition of silicon on the upper and lower surfaces thereof.

Thereafter, and U.S. shown in FIG. 6, the opposite surfaces of wafer 20 are coated with epitaxially deposited N-type silicon which fills wells 22, 23 and 24. One deposition process which may be used is that described in U.S. Pat. No. 3,278,347 where, however, the wafer may be placed on a support which permits deposition on both sides. Alternately, the sides may be coated one at a time. Typically, the wafer is placed in a suitable deposition apparatus and the surfaces exposed to a gaseous mixture of silicon trichlorosilane hydrogen, and a gas containing a suitable N-type doping element such as $PH_3$. The hydrogen reduces the silicon trichlorosilane to deposit monocrystalline silicon layers 25 and 26 on the opposite surfaces of the wafer 20 in FIG. 6 and within wells 22, 23 and 24.

Figure 7:
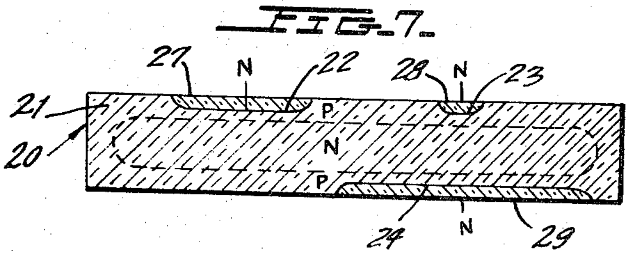
FIG. 7 shows the wafer of FIG. 6 after lapping the upper and lower surfaces.

Layers 25 and 26 are grown to a thickness of about 1 to 2 mils above the wafer surface. These layers are then lapped to expose the P-type surfaces surrounding wells 22, 23 and 24 as shown in FIG. 7, leaving epitaxial layers 27, 28 and 29 in wells 22, 23 and 24, respectively. The wafer may also be etched to remove any epitaxial deposit from the rim thereof.

Figure 9:
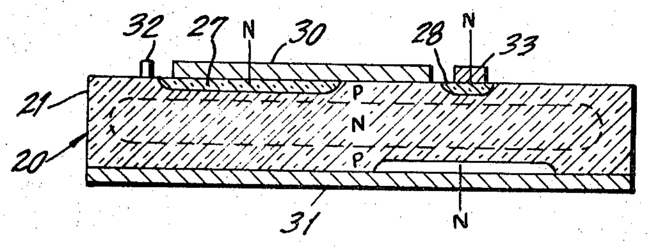
FIG. 9 is a cross-sectional view of FIG. 8 taken across section line 9–9 in FIG. 8.
Figure 8:
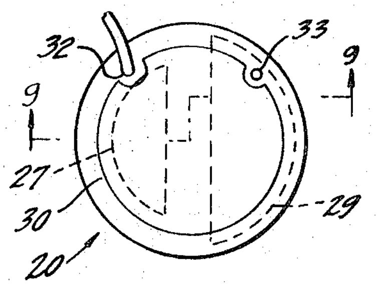
FIG. 8 is a top view of the wafer of FIG. 7 after the connection of electrodes thereto.

Thereafter, electrodes are connected to the wafer, as shown in FIGS. 8 and 9, as main electrodes 30 and 31 and gate electrodes 32 and 33. Note that main electrode 30 is connected to layer 27 and to the surface of the upper P-type region to form a shorted emitter type arrangement. Electrode 33 is connected to layer 28 and gate electrode 32 is connected to the upper P-type region. Electrode 32 may be formed of an aluminum wire bonded to the upper P-type surface by ultrasonic bonding. Contact 33 may be formed of gold leaf having a thickness of 1 mil with about 10per cent antimony impurity, or may be an aluminum wire ultrasonically bonded to layer 28. Contacts 30 and 31 may be of molybdenum, and are secured to the wafer by an aluminum silicon alloy.

Thereafter, an annular groove 34 (FIGS. 10 and 11) is etched around the upper surface of the device to separate the P-type region 21 into separate junctions extending across wafer 20 and terminating on the interior wall of groove 34. Groove 34 serves to prevent metal ion migration to the junction terminations and may be shaped as described in U.S. Pat. No. 3,278,347 to increase the reverse voltage capability of the junctions. The wafer 20 is then suitably cleaned and the groove 34 is then filled with a silastic potting material 35.

The device is now ready to be connected within any suitable housing with leads connected to contacts 30, 31, 32 and 33. Gate contacts 32 and 33 are connected to a common gate lead.

The operation of the device is best understood from FIG. 12 which schematically shows the device of FIGS. 10 and 11. In FIG. 12, numerals 27 to 33 identify similar elements of FIGS. 10 and 11. The junction between epitaxial layer 27 and the lower P-type region is shown as J-1. The junctions between the central N region and upper and lower P regions are identified as junctions J-2 and J-3. The junction between epitaxial region 29 and the adjacent P regions is identified as junction J-4.

In operation, the firing mode for AC control is achieved by biasing the gates 32 and 33 positive when terminal 30 is negative, and negative when terminal 30 is positive. Triggering for AC control is also possible with negative bias on the gates during both half cycles. For DC control, a positive bias will result in operation similar to that of an SCR. This type of operation is made possible since a positive gate bias will not fire the device when terminal 30 is positive.

When terminal 30 is negative, triggering takes place in the same manner as in an SCR. The positive bias at gate 32, with respect to the top N-type cathode layer 27, causes injection of electrons from cathode 27 into the adjacent P-type region. A large percentage of these injected electrons are collected by junction J-2 which is reversed biased. This collector current, in turn, induces a forward bias across junction J-3 which results in injection of holes into the central N-type region. Some of these holes recombine with electrons, but a small percentage of them are collected by reverse biased junction J-2. This hole injection occurs over a larger area of junction J-3 than the area of the initial electron injection from J-1. The ratio of the areas is a function of the diffusion length of electrons in the upper P region and the resistivity of the central N region. Typically, this resistivity may be from 5 ohm cm. to 50 ohm cm., depending on the voltage rating of the device.

The collected holes induce an additional injection of electrons from J-1 over an even larger area than the hole injection area. This counter injection continues until the entire area under the upper N-type region or cathode 27 is conducting and the reverse bias across J-2 has collapsed. Note that, while the counter injection is described as a stepwise process, since collection is not an abrupt occurrence, the growth of the conduction area is a fairly smooth continuous process.

Since terminal 30 is also connected to the upper P-type region, some shunting of the gate signal will occur. This shunt current is, however, minimized by suitable placement of gate 32, as will be later described. The same type of shunting occurs in an SCR with a shorted emitter construction.

When terminal 30 is positive, a negative bias on gate 33 will cause injection from the N-type gate region 28. Many of these injected electrons will recombine with holes. This current can be considered to be as a parasitic diode current between gate 33 and terminal 30 since it has no useful function. Some of the injected electron, however, will be collected by J-2 in the vicinity of gate 33 and cause J-2 to become forward biased. Since terminal 30 is positive with respect to gate 33, J-2 at region 40 will have a greater forward bias than at region 41. This forward bias will cause an injection of holes primarily at region 40 into the central N-type region. Some of these injected holes will be collected by junction J-3 which is now reversed biased. This will induce injection of electrons from J-4 into the lower P-type region which, in turn, will be collected by J-3. Here, again, the counter injection will continue until the entire area over the lower N-type region or cathode is turned on.

As long as the current through the device is maintained above a certain minimum level (holding current) this positive feedback will continue and the device will continue to conduct.

Except for gating, the device of the invention is a symmetric device. The turnoff mechanism, when the device has been conducting in one direction, is virtually the same as turn off in the other direction.

Consider the case where terminal 30 is negative with respect to terminal 31 and the left-hand portion of the device is conducting. The upper P-region and the central N-region in the left-hand portion are flooded with minority carriers.

When the polarity of the device is reversed, some of these minority carriers will recombine with majority carriers and most of the others will be collected by junctions J-1 and J-3. The collection of these stored minority carriers results in the reverse recovery current. This current causes the injection of additional minority carriers from junction J-2. Both electrons are injected into the upper P region and holes are injected into the central N region by junction J-2. The primary effect is the injection of holes into the central N region. This additional injection prolongs the recovery process, but since the $\alpha$ of the upper P region, central N region and lower P region section is quite low at these current densities, only a small percentage of them ever reach J-3.

If a sufficient number of holes are collected at the right-hand section of J-3 to induce injection of electrons by J-4 into the right-hand section of the lower P region, the device will turn on. This can only occur if a large number of holes have diffused from the right-hand section of the central N region to the left-hand portion thereof, or if a sufficient number of holes are injected into the right-hand section by J-2 during the recovery phase of the left-hand section.

The problem is minimized by constructing the device with a horizontal separation between regions 27 and 29 of several minority carrier diffusion lengths and obtaining a high enough sheet resistance of the central N region to minimize injection of carriers from J-2 into the right-hand section of the central N region.

From the foregoing, it is shown that separation of cathode regions creates a new type of gate control and increases the frequency range on which the device may be used. Obviously, the same operation would occur where the device used a reversal of conductivity types with the initial wafer of FIG. 1 being P-type rather than N-type. Where the separation of cathode regions is used, it will also be apparent that the operation of an all-diffused device will follow the description above.

FIGS. 13 and 14 show the invention as applied to an all-diffused device which includes a silicon wafer 50 containing a central N-type region 51, outer P-type regions 52 and 53, N-type cathode regions 54 and 55, main electrodes 56 and 57, forward gate 58 and reverse gate 59 and N-type region 60 beneath gate 59. Note that the adjacent boundaries of cathode regions 54 and 55 are laterally spaced from one another. All regions in FIGS. 13 and 14 are formed by a suitable diffusion process.

In the embodiments of FIGS. 10 and 11 and FIGS. 13 and 14, the forward and reverse gates are shown spaced from one another with the P-type gate 58 laterally spaced from cathode region 55 and the N-type gate directly over cathode region 55. This arrangement prevents the possibility of forming a four-layer device from either gate which could "fire" and thus draw relatively large gate current. With the configuration of FIG. 14, gate 58 essentially defines a P-N-P device (layers 53, 51 and 52) which is connected to layer 55 through the relatively high lateral resistance of layer 52. Gate 59 forms an N-P-N-P-N device through layers 60, 53, 51, 52 and 55. The path from layer 52 which bypasses layer 55 includes the relatively high lateral resistance through layer 52. The relatively high resistance in each case will be sufficient to prevent switching action from either gate, and reduces the possibility of overloading the gate circuit. If desired, gate 58 could be moved to an area external of the outer periphery of junction 54 to permit sufficient room to make the gate contact to the upper surface of the wafer.

Although this invention has been described with respect to particular embodiments, it should be under understood that many variations and modifications will now be obvious to those skilled in the art, and, therefore, the scope of this invention is limited not by the specific disclosure herein, but only by the appended claims.

I claim:

1. A semiconductor wafer structure for a triac; said wafer having a central region extending thereacross of a first of the conductivity types, upper and lower regions of a second of the conductivity types contiguous with the top and bottom of said central region, first and second cathode regions of said first of said conductivity types contiguous with the top and bottom respectively of said upper and lower regions, respectively, a gate region of said first of said conductivity types contiguous with the top of said upper surface of said upper region and laterally spaced from said first cathode region, first and second electrode means connected to said first and second cathode regions, respectively, gate electrode means having a first portion connected to said gate region and a second portion connected to said top of said upper region; said first and second area of the top and bottom surfaces of said wafer; said first and second cathode regions laterally separated from one another by at least three minority carrier diffusion lengths for minority carriers in said central region; said first and second cathode regions being of monocrystalline silicon having a constant impurity concentration throughout their thicknesses; said upper and lower regions having an impurity concentration gradient along the thicknesses thereof.

2. The structure of claim 1 wherein said central region has a resistivity of from about 5 ohm centimeters to about 50 ohm centimeters.

3. The structure of claim 1 wherein said first and second electrode means extend across the upper and lower surfaces of said wafer and electrically connect their respective first and second cathode regions to at least portions of the upper and lower surface of said upper and lower regions adjacent thereto.

4. The structure of claim 1 wherein said gate region has a constant impurity concentration throughout its thickness.

5. The structure of claim 1 wherein said first portion of said gate electrode means connected to said gate region is positioned in registry with and over said second cathode region and said second portion of said gate electrode means connected to the top of said upper region is laterally displaced from said second cathode region.

6. The structure of claim 2 wherein said first and second electrode means extend across the upper and lower surfaces of said wafer and electrically connect their respective first and second cathode regions to at least portions of the upper and lower surface of said upper and lower regions adjacent thereto.

7. The structure of claim 2 wherein said first portion of said gate electrode means is positioned in registry with and over said second cathode region; a said second portion os said gate electrode means connected to the top of said upper region being laterally displaced from said second cathode region.

8. The structure of claim 6 wherein said gate region has a constant impurity concentration throughout its thickness.

9. The structure of claim 8 wherein said first portion of said gate electrode means is positioned in registry with and over said second cathode region; said second portion of said gate electrode means connected to the top of said upper region being laterally displaced from said second cathode region.